United States Patent
Morie et al.

(10) Patent No.: US 6,661,022 B2
(45) Date of Patent: Dec. 9, 2003

(54) INFORMATION PROCESSING STRUCTURES

(75) Inventors: Takashi Morie, Hiroshima (JP);
Atsushi Iwata, Hiroshima (JP);
Makoto Nagata, Hiroshima (JP);
Toshio Yamanaka, Hiroshima (JP);
Tomohiro Matsuura, Hiroshima (JP)

(73) Assignee: Japan Science and Technology Corporation, Kawaguchi (JP)

( * ) Notice: Subject to any disclaimer, the term of this patent is extended or adjusted under 35 U.S.C. 154(b) by 11 days.

(21) Appl. No.: 09/926,698

(22) PCT Filed: Mar. 27, 2001

(86) PCT No.: PCT/JP01/02469
§ 371 (c)(1),
(2), (4) Date: Dec. 4, 2001

(87) PCT Pub. No.: WO01/84634
PCT Pub. Date: Nov. 8, 2001

(65) Prior Publication Data
US 2002/0134996 A1 Sep. 26, 2002

(51) Int. Cl.$^7$ ............................................. H01L 29/06

(52) U.S. Cl. ............................ 257/14; 257/23; 326/36

(58) Field of Search ................... 257/14, 23; 326/36

(56) References Cited

U.S. PATENT DOCUMENTS

| | | | |
|---|---|---|---|
| 5,677,637 A | * 10/1997 | Nakazato et al. | 326/35 |
| 5,889,288 A | * 3/1999 | Futatsugi | 257/20 |
| 5,905,273 A | * 5/1999 | Hase et al. | 257/24 |
| 5,951,711 A | * 9/1999 | Mahant-Shetti et al. | 714/795 |
| 6,208,000 B1 | * 3/2001 | Tanamoto et al. | 257/402 |

FOREIGN PATENT DOCUMENTS

JP   2000-150862   5/2000

OTHER PUBLICATIONS

Ikeda et al., "Control of The Positioning of Self–Assembling Si Quantum Dots on Ultrathin $SiO_2$/c–Si by Using Scanning Probe", *Microprocesses and Nanotechnology*, Oct. 31–Nov. 2, 2001, pp. 282–283.

Kohno et al., "Memory Operation of Silicon Quantum–Dot Floating–Gate Metal–Oxide–Semiconductor Field–Effect Transistors", *Jpn. J. Appl. Phys.*, vol. 40 (2001), pp. L721–L723.

(List continued on next page.)

*Primary Examiner*—Long Pham
*Assistant Examiner*—Douglas A. Wille
(74) *Attorney, Agent, or Firm*—Armstrong, Westerman & Hattori, LLP

(57) ABSTRACT

An information processing structure is disclosed that is formed of single electron circuits each operating rapidly and stably by way of a single electron operation. The information processing structure includes a MOSFET (11), and a plurality of quantum dots (13) disposed immediately above a gate electrode (12) of the MOSFET and each of which is made of a microconductor or microsemiconductor of a nanometer scale in size. Between each of the quantum dots and the gate electrode is there formed an energy barrier that an electron is capable of directly tunneling. The total number of such electrons moved between the quantum dots and the gate electrode is used to represent information. In the structure, a power source electrode (14) is disposed in contact with the quantum dots and a pair of information electrodes (15) is disposed across a quantum dot in contact therewith for having electric potentials applied thereto, representing data of information. Between each of the quantum dots and the power source electrode is there also formed a potential barrier that an electron is capable of directly tunneling. A capacitive coupling is provided between the information electrodes in pair and the quantum dot between them to prevent movement of an electron between the quantum dot and the information electrodes, and an electron is rendered movable by the Coulomb blockade through the quantum dot between the power source electrode and the gate electrode in response to a relative electric potential determined at the information electrodes.

4 Claims, 15 Drawing Sheets

OTHER PUBLICATIONS

Miyazaki et al., "Control of self-assembling formation of nanometer silicon dots by low pressure chemical vapor deposition", *Thin Solid Films 369* (2000), pp. 55–59.

Miyazaki et al., "Control of self-assembling formation of nanometer silicon dots by low pressure chemical vapor deposition", International Joint Conference on Silicon Epotaxy and Heterostructures (IJC–SI), Sep. 12–17, 1999.

Nakagawa et al., "Self-Assembling Formation of Silicon Quantum Dots by Low Pressure Chemical Vapor Deposition", *Mat. Res. Soc. Symp. Proc.*, vol. 452, 1997, pp. 243–247.

Ohba et al., "Novel Si Quantum Memory Structure with Self-Aligned Stacked Nanocrystalline Dots", *Extended Abstracts of the 2000 International Conference on Solid State Devices and Materials, Sendai*, 2000, pp. 122–123.

Saen et al., "A Stochastic Associative Memory Using Single–Electron Tunneling Devices", *IEICE Transactions on Electronics*, vol. E81–C, No. 1, Jan. 1998, pp. 30–36.

Shimano et al., "Reliability of Single Electron Transistor Circuits Based on $E_6/N_0$–Bit Error Rate Characteristics", *Jpn. J. Appl. Phys.*, vol. 38 (1999), pp. 403–405.

Tucker, "Complementary digital logic based on the 'Coulomb blockade'", *J. Appl. Phys.* 72 (9), Nov. 1, 1992, pp. 4399–4413.

Yamanaka et al., "A Stochastic Associative Memory Using Single–Electron Devices and Its Application to Digit Pattern Association", *Extended Abstracts of the 1998 International Conference on Solid State Devices and Materials*, Hiroshima, 1998, pp. 190–191.

Figure on Information Electron Movement.

* cited by examiner (A)

(B)

(A)

(B)

(A)

(B)

(A)

Information electrodes have a different data (B)

Information electrodes have an identical data

INFORMATION PROCESSING STRUCTURES

TECHNICAL FIELD

The present invention relates to an information processing structure for processing information by means of an electronic structure of a nanometer (nm) scale, for example from 10 nm to 0.3 nm and in particular to an information processing structure for detecting similarity of one pattern to another by way of single electron operations.

BACKGROUND ART

The progress of microelectronics techniques for semiconductors in recent years has come to make it possible to manufacture a structure of the so-called nanometer (nm) scale, for example 10 nm or less. Utilizing such a microelectronics technique to fabricate a structure extremely small in electrostatic capacitance makes the so-called Coulomb blockade phenomenon observable that a single electron in the structure has its electrostatic energy so increased that no other electron can come into the structure. And it also makes movement of an individual electron controllable by Coulomb repulsion between them.

It is thus possible to make a small conductor (microconductor or small semiconductor (microsemiconductor)) domain in which an electron can be extant (hereinafter referred to as a "quantum dot") by combining an energy barrier that the electron can directly tunnel (hereinafter referred to as a "tunnel junction") and a coupling with which the electron cannot directly tunnel the barrier hereinafter referred to as a "capacitive coupling"), and then to form an electronic structure by combining such quantum dots. As is well known, such quantum dots can be formed by the self-assembling formation in which silicon quantum dots are formed by low pressure CVD using mono-silane (see Mat. Res. Soc. Symp. Proc. 452 (1997) 243 "Self-Assembling Formation of Silicon Quantum Dots by Low Pressure Chemical Vapor Deposition").

An electronic device when formed of such an electronic structure becomes to be operable by movement of a single electron. Such an electronic device is commonly called a single electron device, and a variety of single electron circuits have been proposed by taking advantage of single electron devices. For example, it is possible to form as an electronic device a complementary transistor akin to a CMOSFET, and a single electron logic circuit using such a complementary transistor has already been proposed (See J. Appl. Phys., Vol. 72, No. 9, 1992, pp. 4399–4413, J. R. Tucker: "Complementary Digital Logic Based on the Coulomb Blockade").

Such proposals made for a single electron logic circuit, however, have so far not gone beyond only its circuit makeup by combining a tunnel junction and a capacitor on the circuit diagram level, and has scarcely as yet been implemented as a practical form, namely as an actual structure of the circuit.

Also, as regards a memory, while a "quantum dot floating gate memory structure" which it is designed to form by microstructuring the conventional floating gate structure has been proposed and made by way of trial, no practical form of implementation or no actual structure of the circuit has as yet been proposed that effectuates logics for information processing.

By the way, there is one important form of information processing operations that detects similarity of one pattern to another. This is a basic processing operation that can be utilized in a wide range of information processing including pattern recognition for associative memory, vector quantization and prediction of a movement and data compression.

In such processing operations, use may be made of a "Hamming distance" as an index to indicate similarity between digital patterns. This is defined by the number of those bits differing from each other of the digital patterns. Thus, it follows that the smaller the difference in the number of such different bits, the smaller the Hamming distance and the higher the similarity between the patterns, viz. more closely the patterns resemble each other. Here, the Hamming distance can be computed, for example, by finding the exclusive ORs (XORs) of corresponding pairs of bits of the two digital patterns and summing those with the 1 output.

By the way, a circuit as shown in FIG. 14(A) having a capacitor $C_0$ combined with a single electron transistor (hereinafter referred to as "SET") made up of a pair of tunnel junctions 1 and 2 exhibits a non-monotone characteristic as presented by the aforementioned Coulomb blockade phenomenon (See Applied Physics [a Japanese journal], Vol. 66, No. 2(1997), p. 100) and therefore, if supplied with voltages Va and Vb via capacitors at an intermediate point between the two tunnel junction 1 and 2, namely at its isolated node 3, exhibits a change with time dependence of its output voltage Vco as shown in FIG. 14(B) depending on a combination in H or L level of the input voltages Va and Vb. Utilizing such a characteristic, there has been proposed a single electron logic circuit designed to provide an XNOR (exclusive NOR or inhibit exclusive OR) gate by combining a single SET with a capacitor $C_0$ (See "A Stochastic Associative Memory Using Single Electron Devices and Its Application to Digit Pattern Association", T. Yamanaka et al, in Ext. Abs. of Int. Conf. on Solid State Devices and Materials, pp. 190–191, Hiroshima, September 1998).

FIG. 15 shows a further single electron logic circuit in which a pair of SETs is connected parallel to each other between a power supply Vdd and a capacitor $C_0$ and to which inverted voltages of Va and Vb are also applied, thus providing a complementary structure. Such single electron logic circuits may be prepared in number equal to the number of bits of digital patterns to be compared with each other and may be connected to a common capacitor ($C_0$) to make up a bit comparator (BC) for the digital patterns as shown in FIG. 16 in which Va represents a bit voltage of one digital pattern to be compared and Vb represents a bit voltage of the other digital pattern to compare with. Then in the SETs in which their respective bits coincide with each other (Va=Vb), the electron moves from the capacitor $C_0$ to the power supply Vdd, raising the potential at the capacitor $C_0$ as shown in FIG. 15(B). It follows therefore that the greater the number of bits coincident with each other, the more rapidly the capacitor potential $Vc_0$ rises. Therefore, examining a transient change in the potential rise permits the size of the relative Hamming distance to be known. A bit comparator for digital patterns of such a construction has already been proposed.

Also, given the fact that a circuit formed of single electron devices operates stochastically, it has previously been known that conversely utilizing this stochastic nature makes it possible to realize an intelligent processing operation which it has been hard to realize in an existing CMOS circuit (See Yamanaka et al, 1998 supra; and IEICE Tramn. Electron., Vol. E81-C. No. 1, pp. 30–35, 1998, M. Saen et al, "A Stochastic Associative Memory Using Single Electron Devices").

No such single electron logic circuit has as yet been proposed, however, as to in what structure it may actually be implemented.

Also, the problem has existed that because as the time elapses the electric potential $V_{co}$ of the capacitor $C_0$ becomes constant without depending on the Hamming distance, the Hamming distance cannot be measured in a stable state.

Further, making a single electron logic circuit by applying the existing architecture of a CMOS logic circuit thereto involves theoretically fatal problems as mentioned below.

First, the fact that the tunneling phenomenon on the basis of which a single electron circuit operates is stochastic requires it to take fairly long before its operation is established, and makes the operation slow. Thus, the single electron logic circuit made by applying the architecture of a CMOS logic circuit must be slower in operation than, and hence fail to be superior to, the conventional CMOS logic circuit.

Second, no stable single electron operation can be obtained unless the electrostatic energy of one electron is enough larger than its thermal energy. This requires that an extremely small capacitance should be realized for a single electron logic circuit to be operated at a room temperature. Thus, in order for a very large scale integrated circuit with, say, $10^{10}$ gates to be operated without fail at the room temperature over 10 years, there must be realized a capacitance as very small as $10^{-20}$ Farad (see Jpn. J. Appl. Phys., Vol. 38, 1999, pp. 403–405, S. Shimano, K. Masu and K. Tsubouchi "Reliability of Single Electron Transistor Circuits Based on $E_b/N_o$-Bit Error Rate Characteristics").

Consequently, providing such a small capacitance requires a structure of a size smaller than the atomic scale but in the actuality is impossible of realization.

Third, a charge tends to be trapped by an impurity and an interfacial energy level that unavoidably are present in the circumference of a dot, and the trapped charge gives rise to a charge in the dot, as it is called "offset charge" or "background charge", thus presenting the problem that the single electron operation cannot be effected ideally.

With the foregoing points taken into account, the present invention is aimed to provide information processing structures formed of a plurality of single electron circuits each of which operates rapidly and stably by way of a single electron operation at a room temperature.

DISCLOSURE OF THE INVENTION

In order to achieve the object mentioned above, there is provided in accordance with the present invention, in a first construction thereof an information processing structure having a MOSFET, and a plurality of quantum dots disposed immediately above a gate electrode of the MOSFET and each of which is made of a microconductor or microsemiconductor of a nanometer scale in size, wherein there is formed between each of the quantum dots and the gate electrode an energy barrier that a charge carrier consisting of either an electron or positive hole is capable of directly tunneling, and the total number of such charge carriers moved between the quantum dots and the gate electrode is used to represent information, wherein the structure comprises: a power source electrode disposed in contact with the said quantum dots; and at least a pair of information electrodes disposed across the said quantum dot in contact therewith for having electric potentials applied thereto, representing data of information, wherein there is formed between each of the said quantum dots and the said power source electrode a potential barrier that a said charge carrier is capable of tunneling, a capacitive coupling is provided between each of the said information electrodes in each of the said pairs and a said quantum dot between them to prevent movement of a said charge carrier between the said quantum dot and each of the said information electrodes, and a said charge carrier is rendered movable by the Coulomb blockade through the said quantum dot between the said power source electrode and the said gate electrode in response to a relative electric potential determined at the said information electrodes.

The object mentioned above is also achieved in accordance with the present invention in a second construction thereof by an information processing structure having a MOSFET, and a plurality of quantum dots of a first group formed immediately above a gate electrode of the MOSFET and each of which is made of a microconductor or microsemiconductor of a nanometer scale in size, wherein there is formed between each of the quantum dots of the first group and the gate electrode an energy barrier that a charge carrier consisting of either an electron or positive hole is capable of directly tunneling, and the total number of such charge carriers moved between the quantum dots of the first group and the gate electrode is used to represent information, wherein the structure comprises: a plurality of lines of quantum dots of a second group each of which lines has at least three quantum dots of the second group arranged in contact with a said quantum dot of the first group associated therewith but not in contact with the said gate electrode; and a plurality of pairs of information electrodes, the said information electrodes in each pair being disposed in contact with those quantum dots of the second group which are formed at opposite ends of each of the said lines, respectively, for having electric potentials applied thereto, representing data of information, wherein a capacitive coupling is provided each between the said quantum dot of the first group and the said quantum dots of the second group in each of the said lines, and between the said quantum dots of the second group in each such line and each of the said information electrodes in each pair corresponding thereto to prevent movement of a said charge carrier each between them, and wherein a change caused in position distribution of a said charge carrier in the said quantum dots of the second group in each such line in response to a relative electric potential determined at the said information electrodes in the pair corresponding thereto makes a said charge carrier movable between the said quantum dot of the first group and the said gate electrode.

In a said information processing structure according to the present invention, the said quantum dots of the first group are preferably arranged in a plurality of lines of quantum dots of the first group.

In a said information processing structure according to the present invention, a said information electrode is preferably formed by at least one quantum dot of a third group, and the number of charge carriers as aforesaid stored on such quantum dots of the third group is used to represent information.

In a said information processing structure according to the present invention, preferably a second power source electrode is formed in contact with the information electrodes formed by the said quantum dots of the third group, there is formed between the said information electrode and the said second power source electrode an energy barrier that a said charge carrier is not capable of directly tunneling, and a voltage or light energy applied to the said energy barrier makes a said charge carrier movable between the said information electrode and the said second power source electrode.

The object mentioned above is also achieved in accordance with the present invention, in a third construction thereof by an information processing structure that comprises: a line of quantum dots each of which is made of a microconductor or microsemiconductor and in which line there is formed between adjacent quantum dots an energy barrier that a charge carrier is capable of directly tunneling; a pair of information electrodes disposed across the said line of quantum dots and in contact with those quantum dots which are located at opposite ends of the said line of quantum dots, respectively, wherein there is provided a capacitive coupling between each of the said information electrodes and the said quantum dot located in contact therewith to prevent movement of a charge carrier between them; and a power source electrode formed in contact with that quantum dot which is located at a center of the said line of quantum dots, wherein there is provided a capacitive coupling between the said power source electrode and the said central quantum dot to prevent movement of a charge carrier between them, wherein the said power source electrode is adapted to have a voltage applied thereto so that the said quantum dots in the line has a potential distribution such that a potential valley is formed about the said central quantum dot, and wherein a charge carrier placed on the said central quantum dot in the line is either immobile, or movable according to thermal fluctuation to one of the information electrode in the pair, depending upon a potential distribution determined by relative voltages at the said information electrodes.

According to an information processing structure of the first construction mentioned above, a plurality of single electron circuits each containing a plurality of quantum dots and a plurality of a pair of information electrode formed on the gate electrode of a MOSFET, and a power supply electrode thereof perform parallel information processing. With each of the single electron circuits taking out its processing result as a drain current on the MOSFET, the structure is capable of achieving a macroscopic information processing operation by putting together the processing results of these single electron circuits on the MOSFET. It can thus accomplish similarity computation for a multi-bit pattern on the single MOSFET.

Here, these single electron circuits permitting extremely low power consumption and a high degree of integration permits a super-parallel processing operation to be adopted to achieve a high processing speed.

Furthermore, parallel operations by a plurality of quantum dots make any strict operation unnecessary but a stochastic operation sufficient, which thus makes the structure operable even at a room temperature.

Furthermore, parallel operations by a plurality of quantum dots allows a redundancy configuration or majority logic to be utilized to control the influence of offset charges over the entire circuit system as much as practicable.

Also, as plural quantum dots may be supplied commonly with an identical input signal, the power source electrode and the information electrodes may be larger in size than the quantum dots and may thus be made up of a wiring pattern by the conventional lithographic method.

An information processing structure of the second construction mentioned above is not only operable well as of the first construction, but also has the advantage that it can quantify the similarity (in terms of Hamming distance) more clearly as the number of electrons in a stable state.

An information processing structure according to the third construction mentioned above has the advantage that it is operable in a wider temperature range and operable even at a room temperature.

If a second power source electrode is formed in contact with the information electrodes formed by the quantum dots such that there is formed between each information electrode and the second power source electrode an energy barrier that a charge carrier is not capable of directly tunneling, and a voltage or light energy applied to said energy barrier makes a charge carrier movable between the information electrode and the second power source electrode, it follows that the charge carrier is placed and held on the information electrode with the aid of the voltage or light energy, thus facilitating entry of data of information onto the information electrodes.

BRIEF DESCRIPTION OF THE DRAWINGS

The present invention will better be understood from the following detailed description and the drawings attached hereto showing certain illustrative forms of embodiment of the present invention. In this connection, it should be noted that such forms of embodiment illustrated in the accompanying drawings hereof are intended in no way to limit the present invention but to facilitate an explanation and understanding thereof.

In the drawings.

BEST MODES FOR CARRYING OUT THE INVENTION

Now, a detailed explanation is given in respect of an information processing structure according to the present invention as a first, preferred form of embodiment thereof with reference to the drawings.

Figure 1:
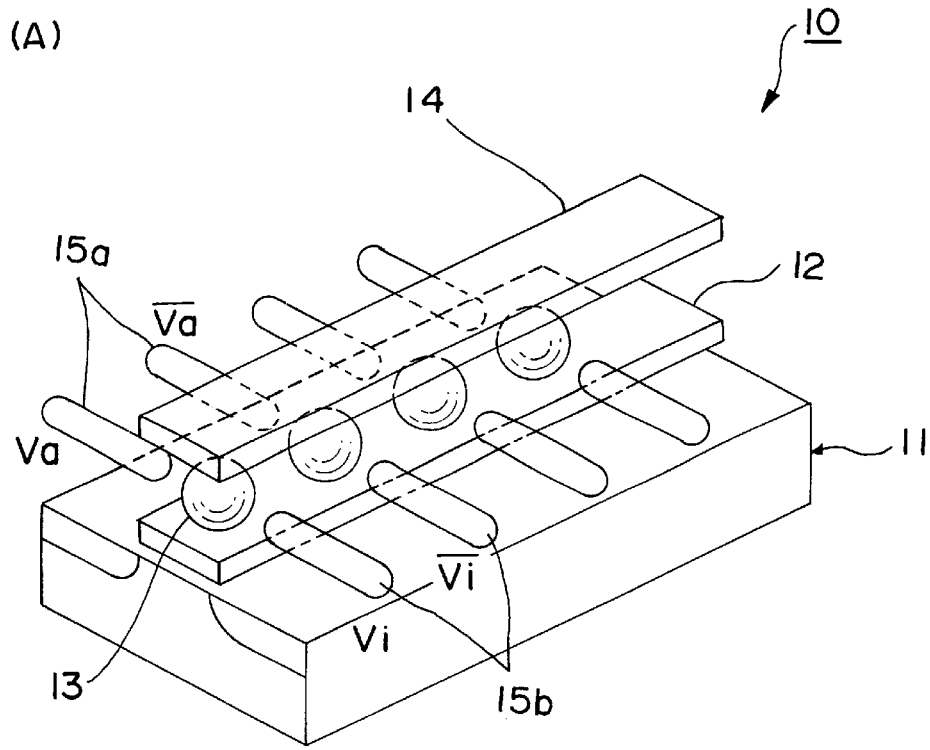
FIG. 1 shows the makeup of an information processing structure as a first form of embodiment thereof according to the present invention, in which (A) and (B) are a diagrammatic perspective and a cross sectional view thereof.
Figure 1:
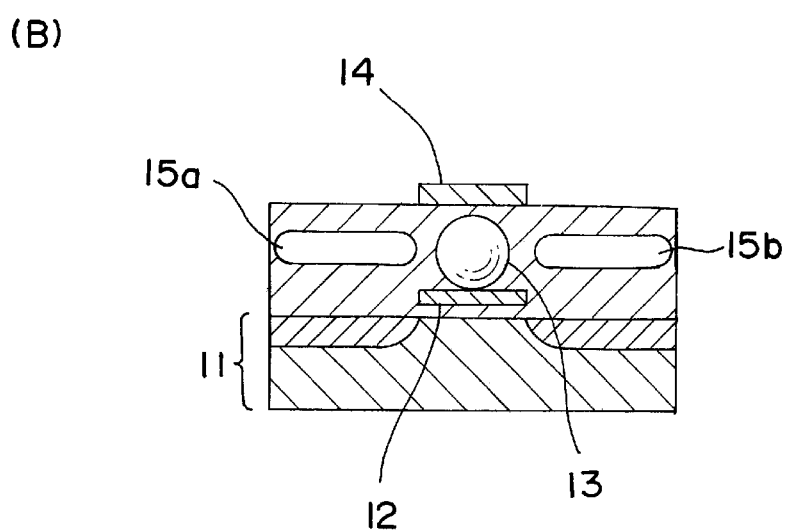
Figure 2:
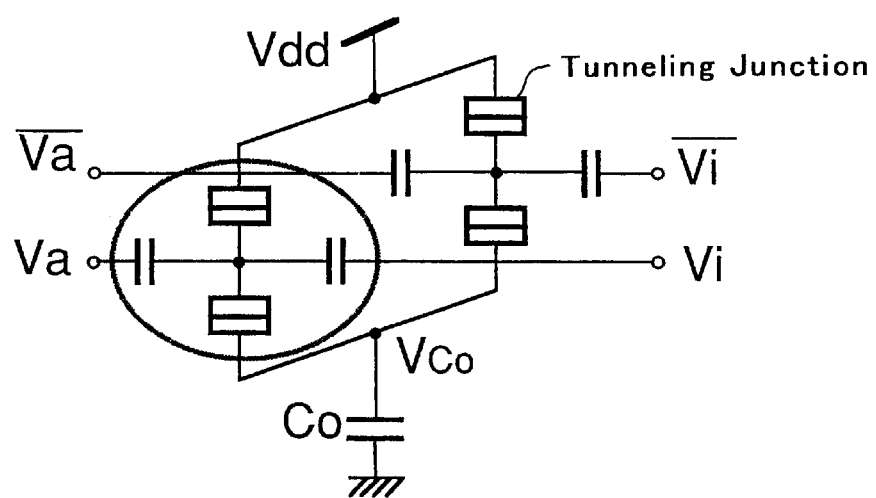
FIG. 2 is a diagram illustrating an equivalent circuit of a single electron circuit including a pair of quantum dots forming the information processing structure shown in FIG. 1.

FIGS. 1 and 2 show the first form of embodiment of the information processing structure according to the present invention.

Referring to FIG. 1, the information processing structure designated by reference character 10 comprises a plurality of quantum dots 13 having a size of 10 nm to 0.3 nm and made up directly above a gate electrode 12 of a MOSFET 11, a power source electrode 14 formed above the quantum dots 13 so as to come from the above into contact therewith, and a like plurality of pairs of information electrodes 15 associated with the quantum dots 13, respectively, and formed so as to come in contact with the quantum dots 13 from their opposite sides, respectively.

Each of these quantum dots 13 which are formed in a line along the gate electrode 12 is constituted from a microconductor or -semiconductor formed, e.g., by a method of self-assembling formation and corresponds to an isolated node of a SET.

Further, each quantum dot 13 makes a tunnel junction with the gate electrode 12. And, the gate capacitance of the MOSFET 11 corresponds to the aforementioned capacitance $C_0$.

The power source electrode 14 as illustrated is made in the form of a plate such as to come in contact with all the quantum dots 13 from the above and to make a tunnel junction with each of them. Further, the power source electrode 14 is supplied with a power supply voltage $V_{dd}$.

The information electrodes 15 are made of a first set of information electrode 15a (Va) each of which is positioned at one side of an adjacent quantum dot 13 and provided with an input pattern and a second set of information electrodes 15b (Vi) each of which is positioned at the other side of the adjacent quantum dot 13 and provided with a reference pattern, each of the information electrodes 15a and 15b being coupled with the quantum dot 13 between them in a capacitive coupling.

While the information electrodes 15 in the form of embodiment illustrated are made in the form of a wiring pattern formed by lithography, they may be made up by quantum dots stored with electric charges.

Further, as plural quantum dots 13 may be supplied commonly with an identical input signal, the information electrodes 15 may have the wiring pattern made thicker in size than the quantum dots 13, or the quantum dots corresponding to the information electrodes 15 may be made greater.

In this manner, a pair of quantum dots 13 together with two pairs of information electrodes 15a and 15b is designed to make up a pair of SETs whose equivalent circuit is shown in FIG. 2. This takes a makeup of the single electron logic circuit as shown and described earlier in connection with in FIG. 15.

Figure 15:
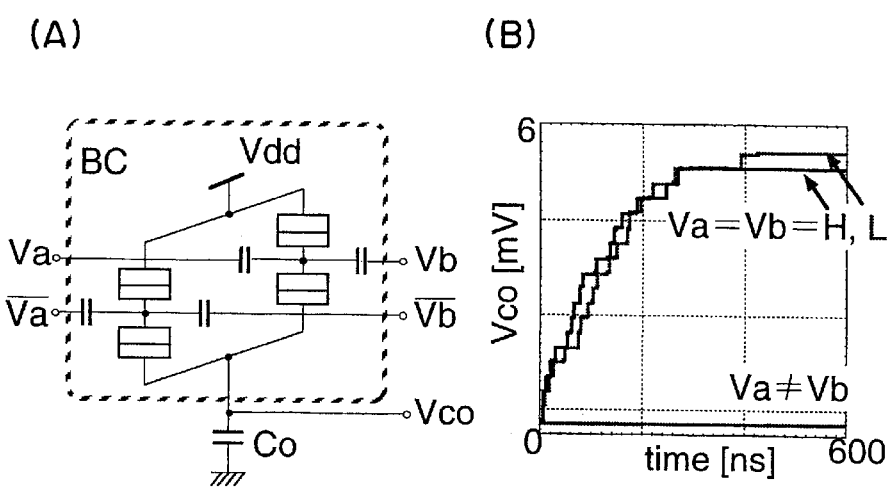
FIG. 15 shows the makeup of a single electron transistor pair, in which (A) is a circuit diagram and (B) is a graph illustrating an operation thereof.
Figure 16:
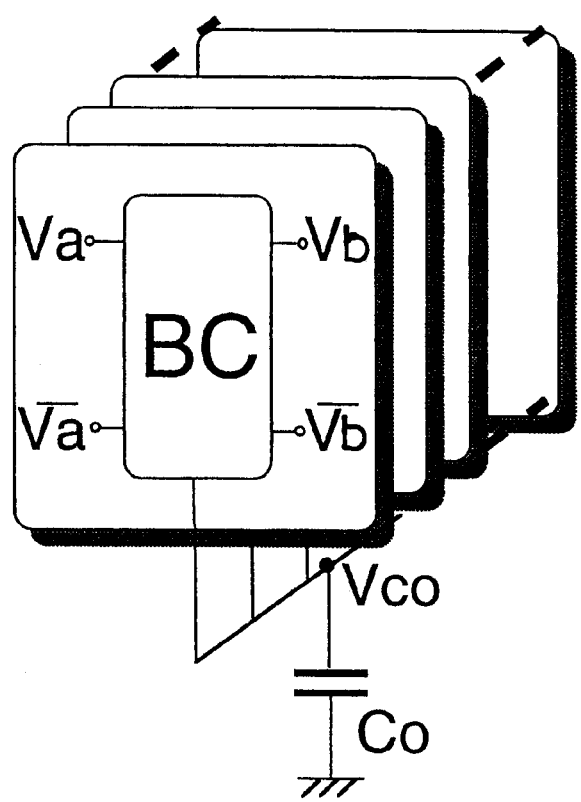
FIG. 16 is a schematic diagram illustrating a single electron logic circuit formed by combining a plurality of single transistor pairs as shown in FIG. 15.

Constructed as mentioned above, the information processing structure 10 according to the present invention is made operable to perform information processing as is the single electron logic circuit shown in FIG. 15 by having, for each pair of SETs, one pair of information electrodes 15a and 15b supplied with input voltages Va and Vi for each bit of two digital patterns to be compared with each other and the other pair of information electrodes 15a and 15b supplied with inverting voltages Va and Vi. The result is a rise in the electric potential of the capacitor $Vc_0$, which further can be taken out as a drain current of the MOSFET.

Thus, since as with the single electron logic circuit shown in FIG. 15, the greater the similarity between the two digital patterns being compared, the smaller the Hamming distance and the quicker the rise in the electric potential of the capacitor $C_0$, the Hamming distance can indirectly be determined by comparison of the rate of such rise.

In this case, the SET pairs each of which requires only an extremely low power consumption and which can be integrated at an extremely high density makes the circuit operable as a whole to process information rapidly by having their super-parallel operation.

Further, the parallel operation of a plurality of quantum dots 13 permits the use of their redundancy configuration and majority logic to limit the influence of offset charges to possible minimum in the circuit as a whole.

Here, the power source electrode 14 can be made as a wiring by the conventional method, e.g., of lithography, and this makes it possible to form a parallel or redundancy configuration more simply and at a reduced cost.

Further, the ability of the information electrodes 15 if made by quantum dots to hold electrons and hence themselves to store information makes it unnecessary to provide them with any additional information storing means.

An explanation is next given in respect of an information processing structure according to the present invention as a second form of embodiment thereof.

Figure 3:
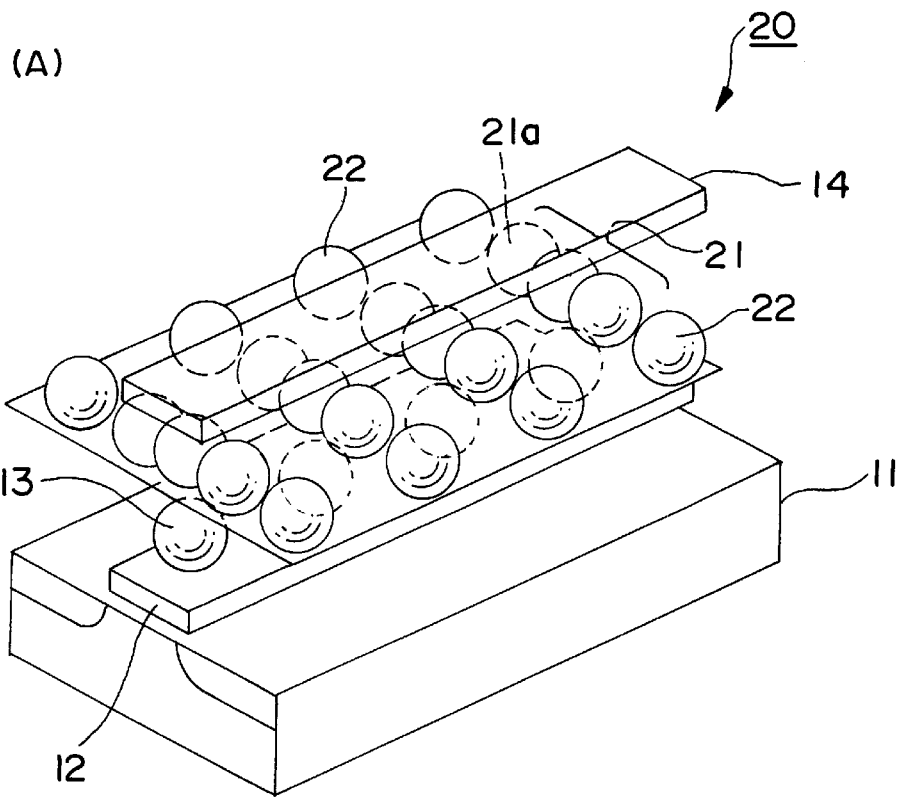
FIG. 3 shows the makeup of an information processing structure as a second form of embodiment thereof according to the present invention, in which (A) and (B) are a diagrammatic perspective and a cross sectional view thereof.
Figure 3:
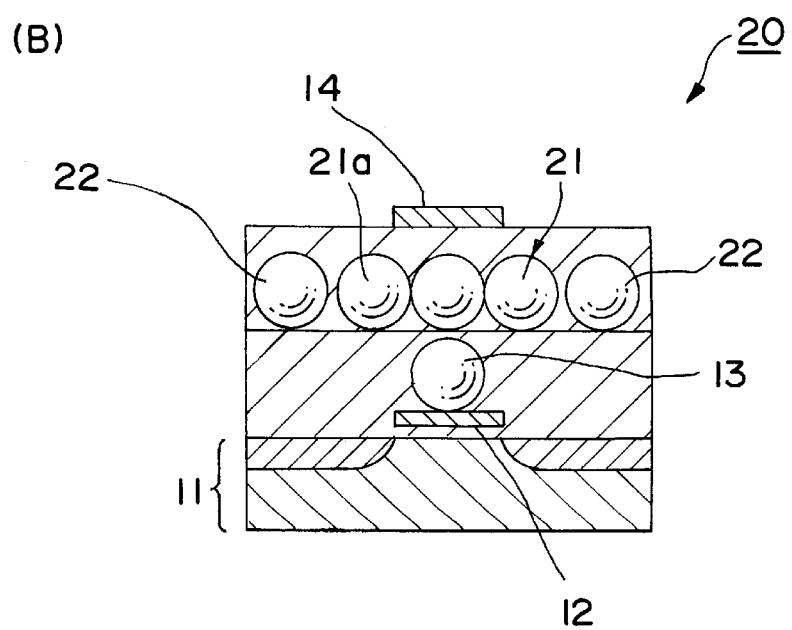

FIGS. 3 to 6 show the second form of embodiment of the information processing structure according to the present invention. Referring to FIG. 3, the information processing structure designated by reference character 20 comprises a plurality of quantum dots 13 made up in a line on a gate electrode 12 of a MOSFET 11, a like plurality of rows 21 of quantum dots 21a of a second group, each row 21 having three such quantum dots 21a, made up above the quantum dots 13 so each row of quantum dots 21a come into contact with an adjacent one of the quantum dots 13 from the above, a power source electrode 14 formed above the rows 21 of quantum dot of the second group 21a so as to come into contact with thereto from the above, and a like plurality of pairs of quantum dots 22 formed as information electrodes for the rows 21 of the quantum dots of the second 21a, respectively, and formed so as to come in contact with those quantum dots of the second group 21a located at the opposite ends of their rows from their opposite sides, respectively.

It should be noted here that the same reference characters as in FIG. 1 are used to designate the same constituent elements whose repeated explanation is here omitted.

A tunnel junctions is made between each adjacent pair of quantum dots 21a of the second group in each of the rows 21, and a capacitive coupling is provided between each of those quantum dots of the second group 21a located at the opposite ends of each if the rows 21 and its counterpart information electrode 22 and so is between each of the quantum dots 21 of the second group and the power source electrode 14.

Each pair of information electrodes 22 is provided across each corresponding row 21 of the three quantum dots of the second group 21a, respectively, and each of the information electrodes 22 is itself formed from a quantum dot.

Figure 4:
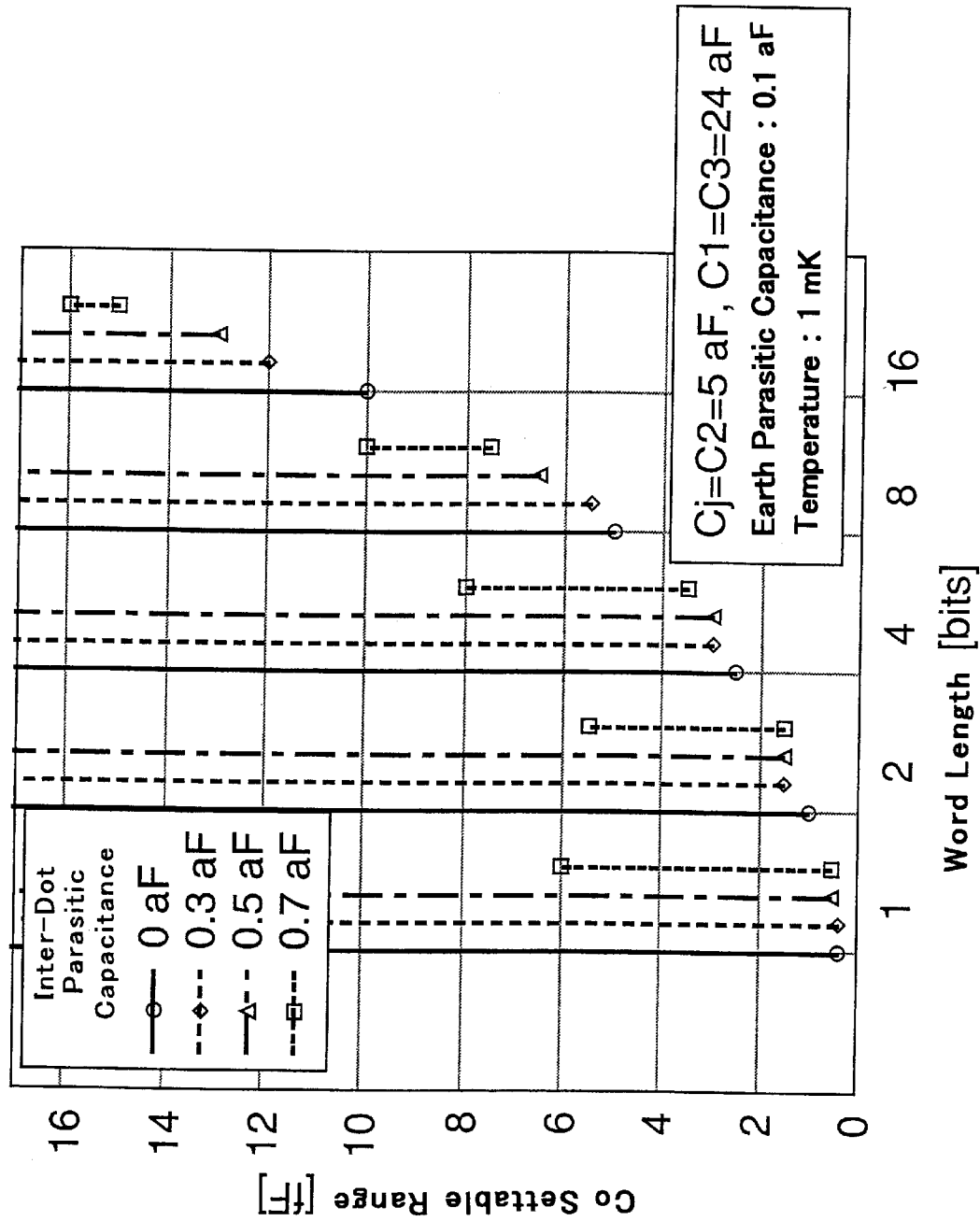
FIG. 4 is a graph illustrating a relationship between the word length and the capacitor's capacitance requirement in the information processing structure shown in FIG. 3.

FIG. 4 shows a range of values of capacitance $C_0$ required for a single electron logic circuit in this information processing structure to operate, which values are computed according to the Monte Carlo simulation method using a parasitic capacitance between the quantum dots as a parameter. Since even a capacitance $C_0$ of $10^{-15}$ F makes the circuit operable as shown in FIG. 4, it will be seen that for the MOSFET 11 use may possibly be made of a fine MOSFET having a gate length in the order of 10 nm.

Figure 5:
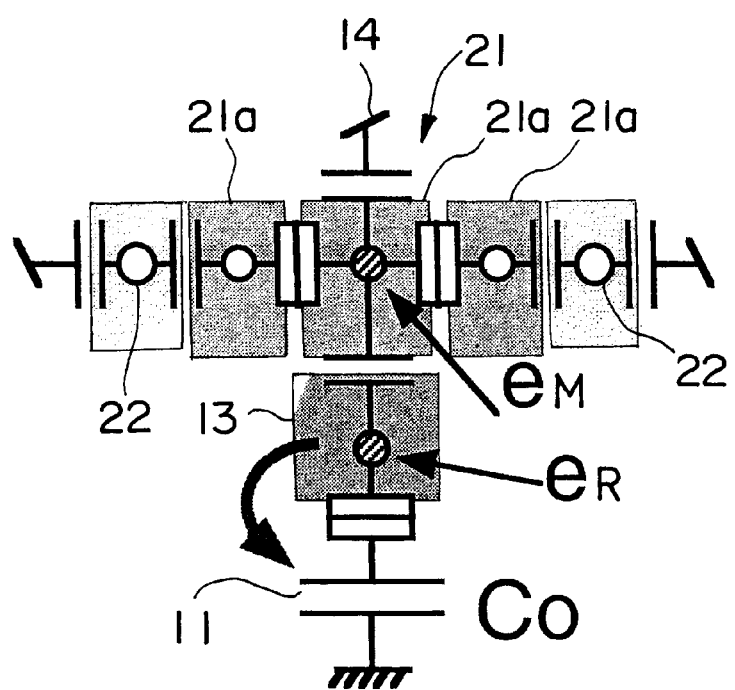
FIG. 5 is an equivalent circuit diagram illustrating the makeup of the information processing structure shown in FIG. 3.

In the information processing structure 20 constructed as mentioned above, a single quantum dot 13 in combination with a set as a row 21 of quantum dots of the second group 21a and a pair of information electrodes 22 makes up a single electron circuit whose equivalent circuit is shown in FIG. 5.

Figure 6:
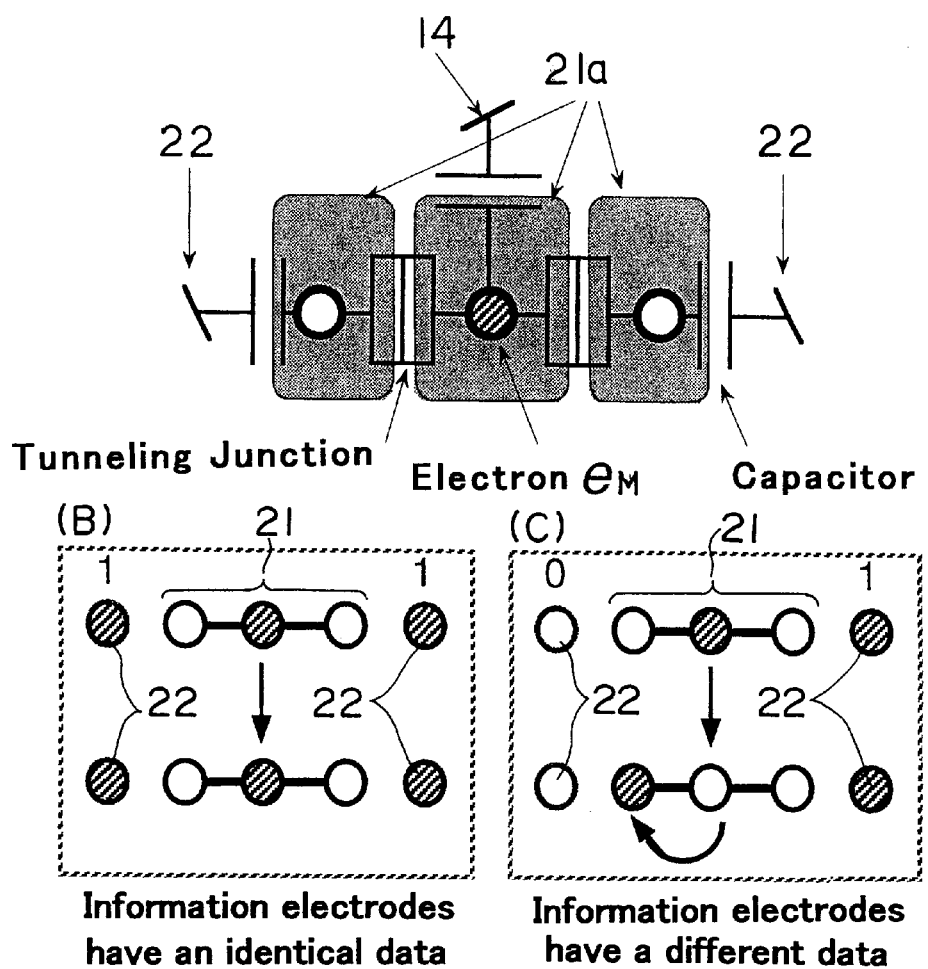
FIG. 6 is a schematic diagram illustrating operating principles involved in the information processing structure shown in FIG. 3.

Thus, an electron $e_M$ is placed on a quantum dot of the second class 21a (the central quantum dot 21a as shown) in the row 21 as shown in FIG. 6. This can be achieved by applying a high voltage to the power source electrode 14 to supply the quantum dot 21a with an electron, for example, by utilizing the Fowler-Nordheim tunneling phenomenon.

Alternatively, the row 21 of quantum dots may have at its outside a second power source electrode (not shown) capacitively coupled thereto to which a high voltage can be applied to supply the quantum dot 21a with an electron likewise by utilizing the Fowler-Nordheim tunneling phenomenon. In this case, that portion of the second electrode may also be irradiated with a light to cause the electron to tunnel with the aid of light energy.

This eliminates the need to lead a wiring pattern about to separately place the electron and moreover makes it possible to store the quantum dot directly with a digital pattern such as image data.

It should be noted here that if a pair of information electrodes 22 across the row 21 of quantum dots have an equal electric potential, then the Coulomb forces acting on the electron $e_M$ become symmetrical, thus making the electron $e_M$ standstill at the central quantum dot 21a as shown in FIG. 6(B).

Conversely, if the two information electrodes 22 have different electric potentials, the electron $e_M$ will come off the central quantum dot 21a, moving to the quantum dot 21 at either end of the row (as shown, at its left hand side end) to stabilize there.

This makes it possible to find if or not the data at the two information electrodes 22 are equal to each other by determining if or not the electron $e_M$ lies at the central quantum dot 21a. To wit, the row 21 of quantum dots does serve to effectuate an exclusive OR operation by acting as a judgment dot row.

Thus, in the row 21 of quantum dots the electrons $e_M$ moved in response to the electric potentials at the two information electrodes 22 can be detected from the electrons $e_R$ placed on the quantum dot 13.

To wit, as shown in FIG. 5 if the central second quantum dot 21a in the row 21 of quantum dots has an electron $e_M$ still positioned thereon, an electron $e_R$ on the quantum dot 13 is caused to tunnel to the capacitor $C_0$ by receiving the Coulomb repulsion from the electron $e_M$. Accordingly, the information processing structure 20 provides a bit comparator, namely an exclusive OR (XOR). Thus, as in the information processing structure 10 shown in FIG. 1 a plurality of bit such comparators can be connected together for the capacitor $C_0$ in common to store on the capacitor $C_0$ a number of electrons depending on a Hamming distance and to draw them as a drain current of the MOSFET. In this case, the Hamming distance can be expressed accurately as it is detected as a number of electrons on the capacitor $C_0$ in its stable state.

It should be noted here that the quantum dot 13 on which the electrons $e_R$ moved to the capacitor $C_0$ were initially positioned can be initialized by applying a bias voltage adjustably to the quantum dot 13 to return those electrons $e_R$ thereto.

Figure 7:
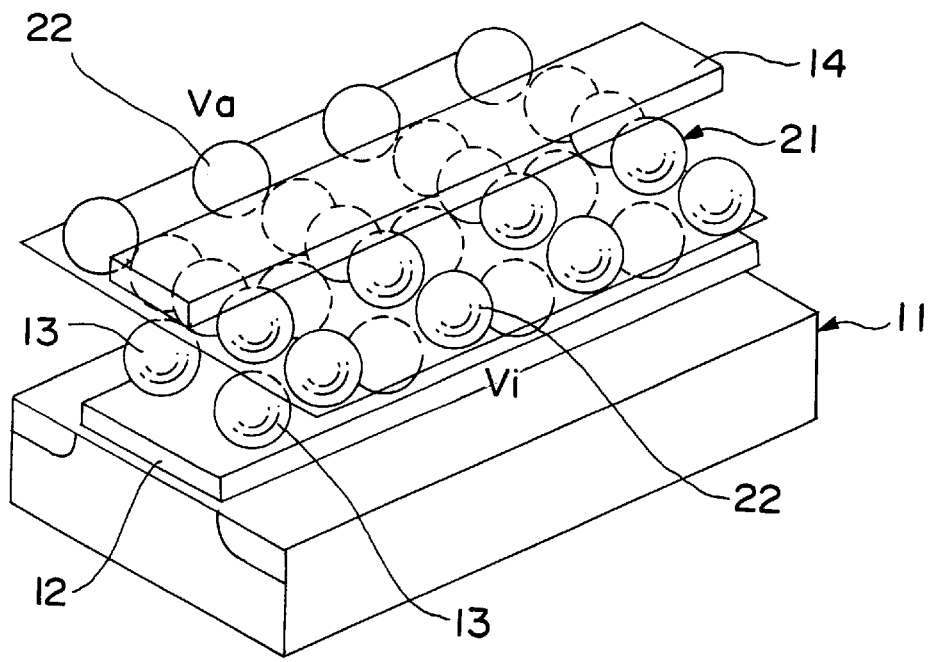
FIG. 7 shows the makeup of a modification of the information processing structure shown in FIG. 3, in which (A) and (B) are a diagrammatic perspective and a cross sectional view thereof.
Figure 7:
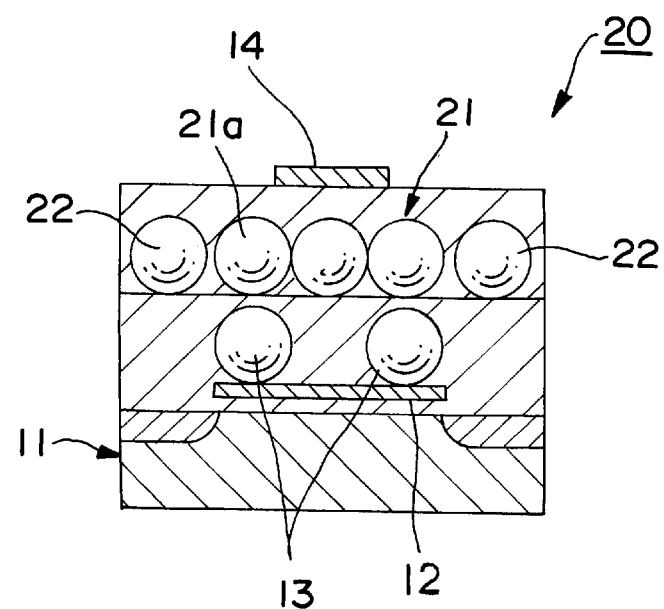

While in the information processing structure 20 shown in FIG. 3 a single quantum dot 13 is disposed in opposition to the central second quantum dot 21a in the row 21 of quantum dots, as shown in FIG. 7 two quantum dots 13 may be disposed in opposition respectively to the second quantum dots at the both ends of the row 21 of quantum dots of which the central second quantum dot 21a has electrons $e_M$ placed thereon. In this case, two such quantum dots 13, a set as the row 21 of quantum dots and a pair of information electrodes 22 together make up a single electron circuit whose equivalent circuit is shown in FIG. 8.

In such a construction as well, in the row 21 of quantum dots the electron $e_M$ moved in response to the different electric potentials at the two information electrodes 22 can be detected from electrons $e_R$ placed on the quantum dots 13.

Figure 8:
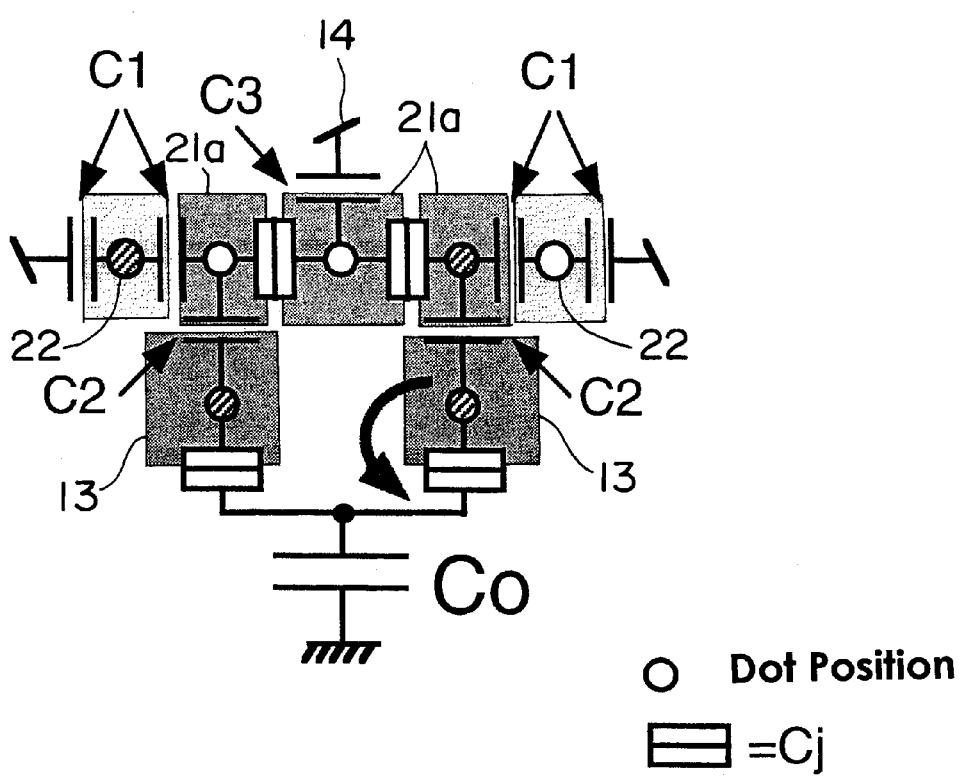
FIG. 8 is an equivalent circuit diagram illustrating the makeup of the information processing structure shown in FIG. 7.

To wit, as shown in FIG. 8 if the central quantum dot of the second class 21a in the row 21 has no electron $e_M$ yet positioned thereon, an electron $e_R$ on either of the two quantum dots 13 is caused to tunnel to the capacitor $C_0$ by the Coulomb repulsion caused between the electron $e_R$ and the electron $e_M$ positioned on the second quantum dot 21a opposing to that quantum dot 13. Accordingly, the information processing structure 20 here again provides a bit comparator, namely an inhibit exclusive NOR (XNOR). Thus, here again a plurality of such bit comparators can be connected together for the capacitor $C_0$ in common to store on the capacitor $C_0$ a number of electrons depending on a Hamming distance and to draw them as a drain current of the MOSFET.

An explanation is next given in respect of an information processing structure according to the present invention as a third form of embodiment thereof.

FIGS. 9 to 13 show the third form of embodiment of the information processing structure according to the present invention.

Figure 9:
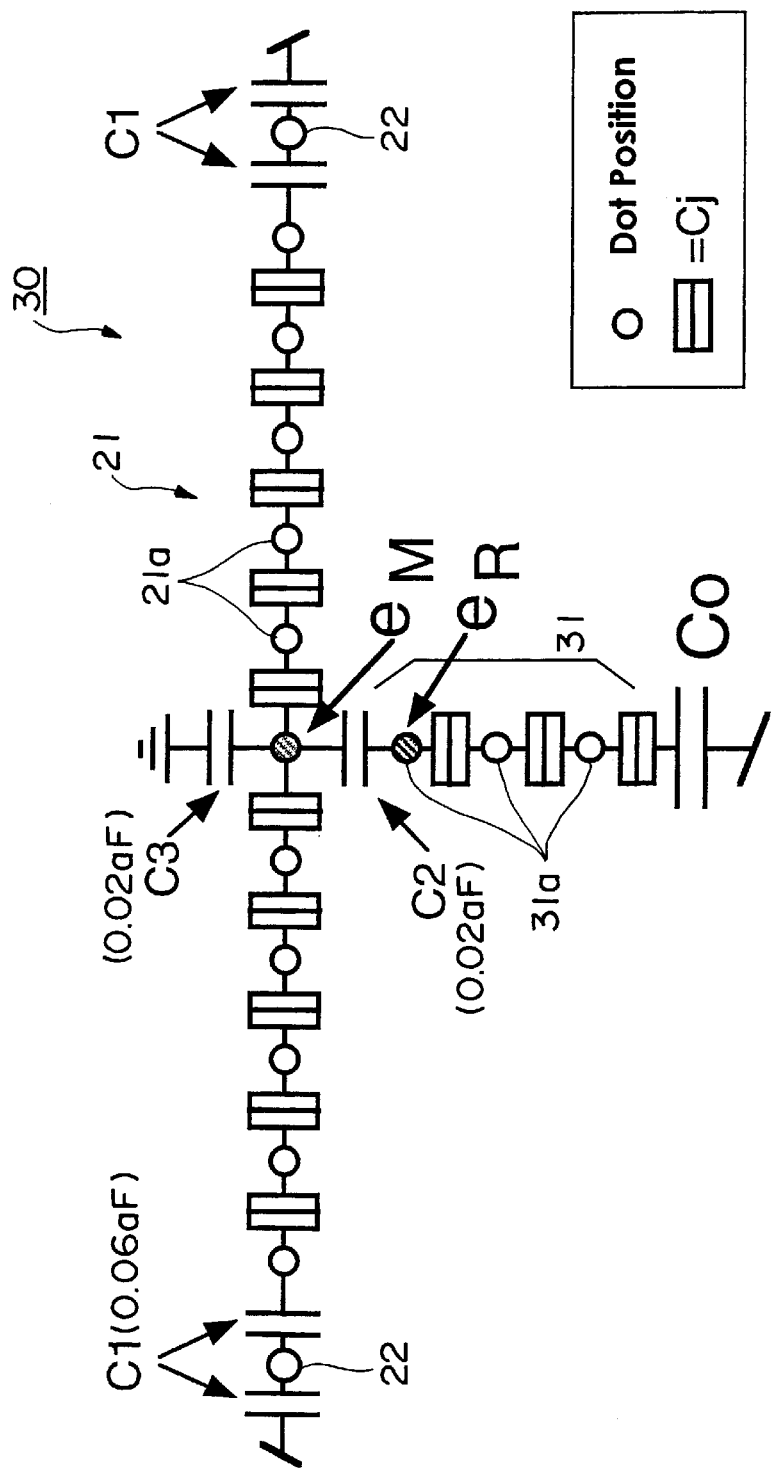
FIG. 9 is an equivalent circuit diagram illustrating an information processing structure as a third form of embodiment thereof according to the present invention.
Figure 10:
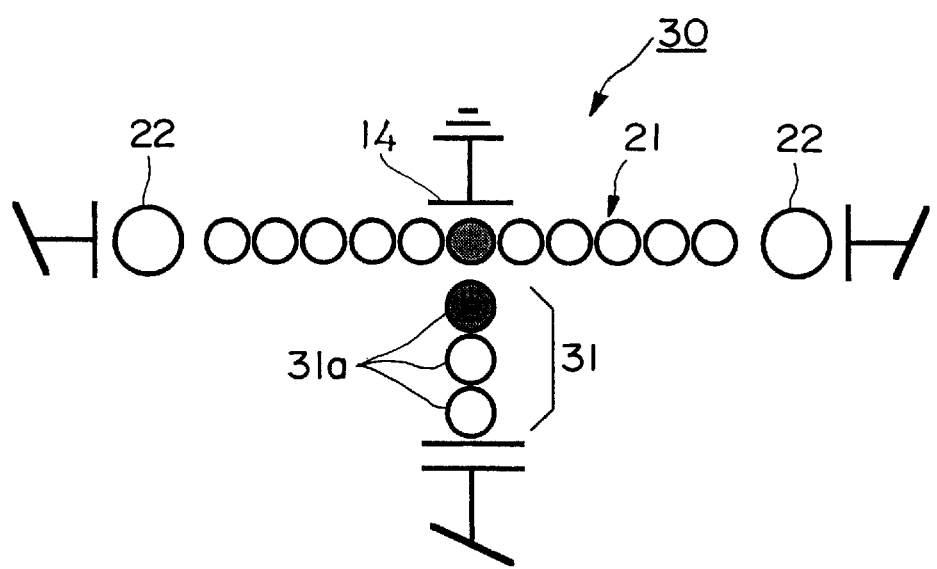
FIG. 10 is a schematic diagram illustrating on schematization the information processing structure shown in FIG. 9.
Figure 11:
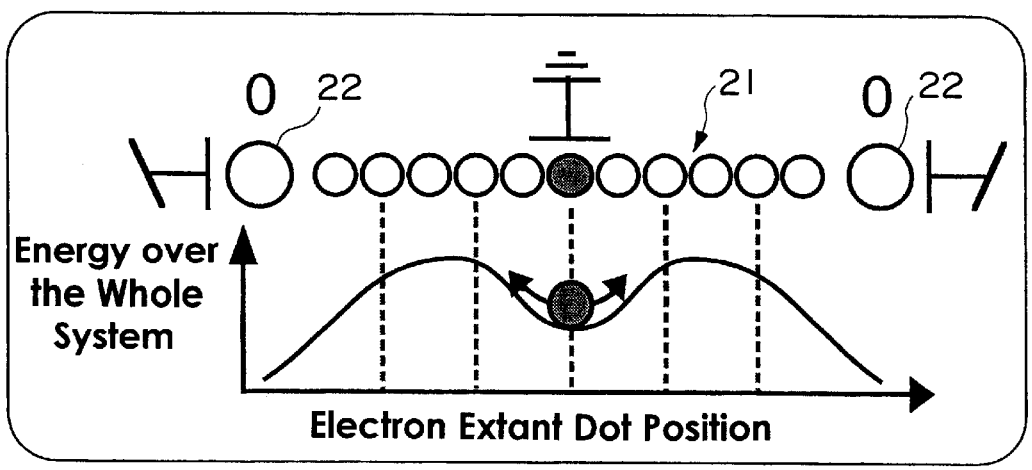
FIG. 11 is a schematic diagram illustrating operating principles involved in the information processing structure shown in FIG. 9.
Figure 11:
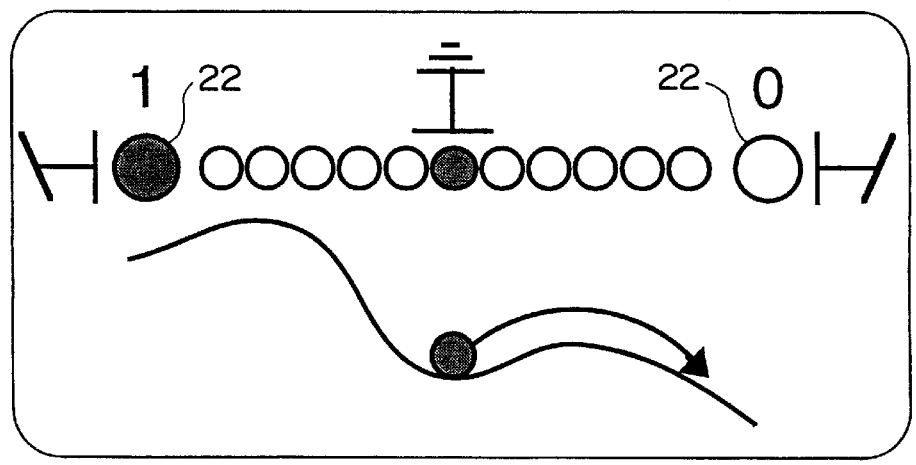

Referring to FIG. 9, the information processing structure designated by reference character 30 differs from the information processing structure shown in FIG. 3 in that the second quantum dots 21a that make up the row 21 of quantum dots are increased in number to, e.g., eleven (11), that one quantum dot 13 is replaced by a row 31 of three quantum dots 31a, and that the central second quantum dot 21a in the row 21 of quantum dots is connected via a capacitive coupling to the ground. This construction of the information processing structure 30 is diagrammatically illustrated as in FIG. 10 indicating the quantum dots, the distances between the quantum dots and the distances between the quantum dots and electrodes.

For the illustrated construction of the information processing structure 30, suitably setting electric potentials at the information electrodes 22 gives rise to a configuration thereof as shown in FIG. 11(A) in which the row 21 of the quantum dots in electric potential is low to some extent at its center and the lowest at its opposite ends, providing a pair of potential barriers.

Consequently, if the two information electrodes 22 are identical to each other in electric potential, then these potential barriers cause an electron placed at the center to stay there and make it unable to move. However, as temperatures rise and time elapses, such an electron at the center is aided by the thermal energy that is thermal fluctuation to become capable of crossing over the potential barriers at the both sides, thereby moving to reach the quantum dots 21a at the opposite ends of the row.

Figure 12:
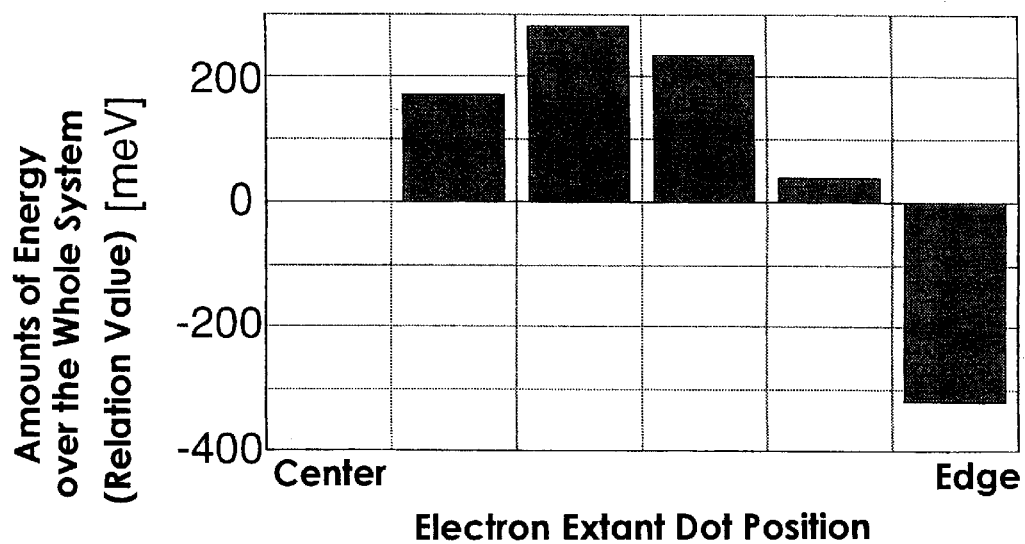
FIG. 12 is a graph illustrating a potential barrier in the information processing structure shown in FIG. 9.
Figure 13:
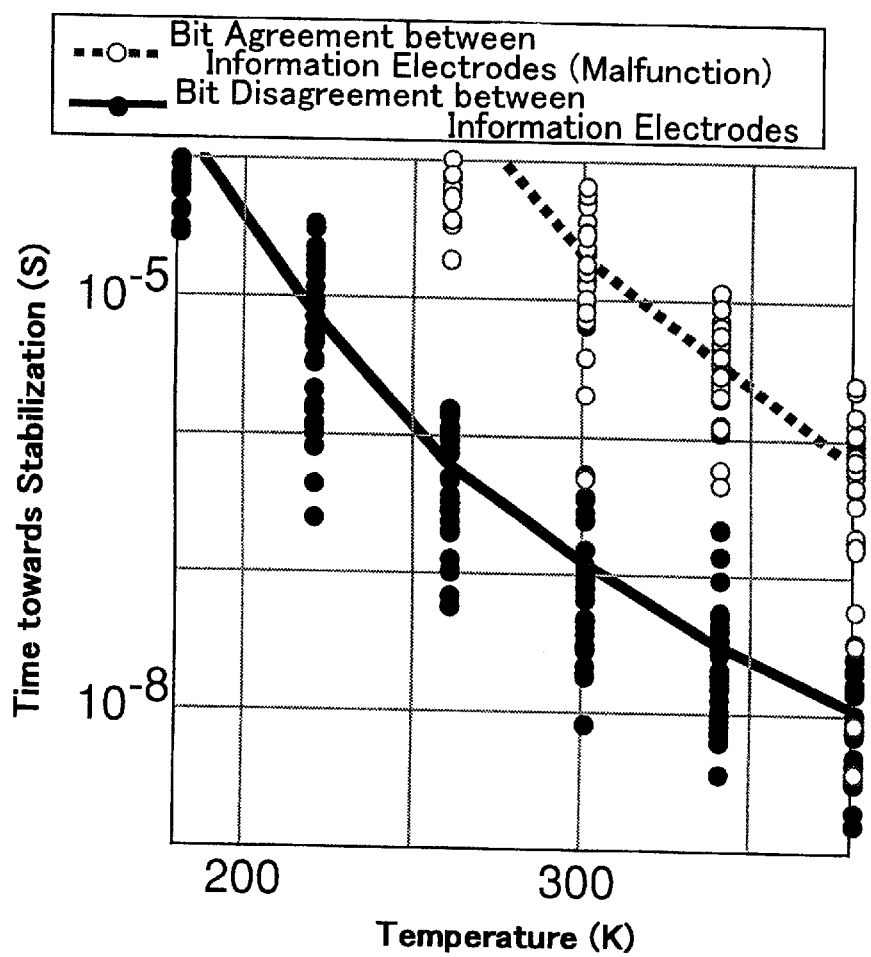
FIG. 13 is a graph illustrating an operational simulation for the information processing structure shown in FIG. 9.
Figure 14:
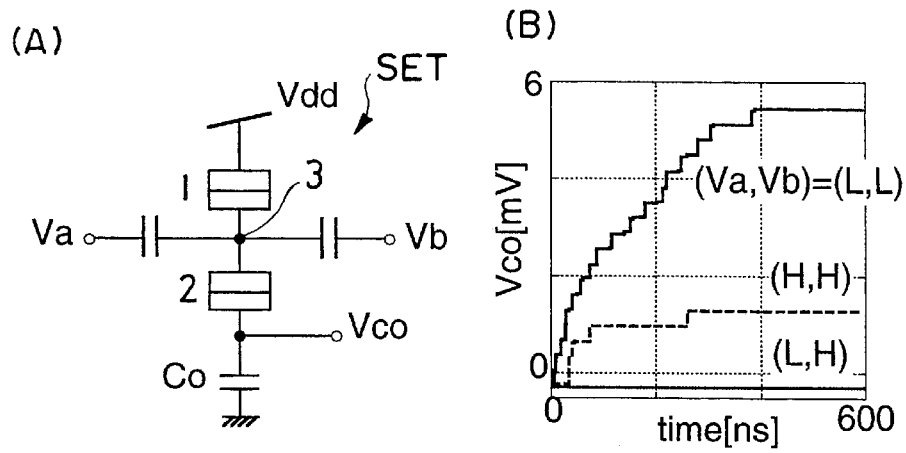
FIG. 14 shows the makeup of a single electron transistor, in which (A) is a circuit diagram and (B) is a graph illustrating an operation thereof.

On the other hand, if the information electrodes 22 differ from each other in electric potential, then a change in pattern of potential barriers develops as shown in FIG. 11(B) that the potential barrier towards one side (as shown, the right hand side) of the row 21 of quantum dots lowers in height and so does the potential barrier up to there, thereby rendering the electron located at the center capable of moving to reach the quantum dot 21a at the right hand side end of the row. The results of simulating the amounts of energy over the whole system with respect to the positions of the quantum dots in which the electron is extant are shown in the graph of FIG. 12.

Thus, when observed in a give time range near the room temperature, it is found that if the information electrodes 22 and 22 are identical to each other in electric potential, the electron will be located at the central quantum dot in the row of quantum dots and that if these information electrodes differ from each other in electric potential the electron will be located at the quantum dot at either end of the row of quantum dots.

Thus, here again as in the information processing structure shown in FIG. 3 a plurality of such a structure constructed as shown in FIG. 9 can be connected together for the capacitor $C_0$ in common to store on the capacitor $C_0$ a number of electrons depending on a Hamming distance and to draw them as a drain current of the MOSFET.

In this case, the information processing structure 30 having a row of quantum dots 21 made up of a larger number of quantum dots 21a permits a stochastic operation taking advantage of thermal fluctuation and is thus operable enough at a room temperature.

Assuming, for example, the capacitance of the capacitor $C_0$ to be 100 aF and the tunneling resistance to be 5 MΩ, an observation of the structure in a time range in the order of $10^{-6}$ second has found that it is operable to perform a substantially proper XOR operation at a room temperature of 300 K.

In this case, while the information processing structure 30 operating stochastically does not yield a strict XOR operation, it is noted that not only can the accuracy of operation be improved by finding an electric potential averaged over a suitable time period but also an active utilization of the stochastic operability makes it possible to perform an intelligent processing operation which an existing CMOS circuit has been unable to effectuate.

Although in the forms of embodiment hereinbefore illustrated, the charge carriers movable according to electric potentials of information electrodes are described as electrons, it is obvious that they are not limited so but may be positive holes as well.

Although the present invention has hereinbefore been set forth with respect to certain illustrative forms of embodiments thereof, it will readily be appreciated to be obvious to a person skilled in the art that many alternations thereof, omissions therefrom and additions thereto can be made without departing from the essences of scope of the present invention. Accordingly, it should be understood that the invention is not intended to be limited to the specific forms of embodiment thereof set forth above, but to include all possible forms of embodiment thereof that can be made within the scope with respect to the features specifically set forth in the appended claims and encompasses all the equivalents thereof.

Industrial Applicability

As will be appreciated from the foregoing description, the present invention provides an information processing structure in which a plurality of single electron circuits each containing a plurality of quantum dots formed on the gate electrode of a MOSFET and each of 10 nm to 0.3 nm in size perform parallel information processing. With each of the single electron circuits taking out its processing result as a drain current on the MOSFET, the structure is capable of achieving a macroscopic information processing operation by putting together the processing results of these single electron circuits on the MOSFET. It can thus accomplish similarity computation for a multi-bit pattern on the single MOSFET.

An information processing structure according to the present invention described as the first form of embodiment thereof has the advantage that it can compare patterns with each other as to their similarity in a simple construction. An information processing structure according to the present invention described as the second form of embodiment thereof has the advantage that though less simple than the first it can quantify the similarity (in terms of Hamming distance) more clearly as the number of electrons in a stable state. Further, an information processing structure according to the present invention described as the third form of embodiment thereof has the advantage that it is operable in a wider temperature range and operable even at a room temperature.

As aforesaid, the present invention requiring an extremely low power consumption and permitting a high degree of integration permits a massively-parallel processing operation to be adopted to achieve a high processing speed. Furthermore, parallel operations by a plurality of quantum dots allows a redundancy configuration or majority logic to be utilized to control the influence of offset charges over the entire circuit system as much as practicable. Consequently, an information processing structure according to the present invention is applicable to a device that executes information processing by utilizing pattern's similarity, to an intelligent processing or learning machines based on neural networks, and further to an associative processor or the like.

It has thus far been shown that an information processing structure formed of highly improved single electron circuits each operating rapidly and stably by way of a single electron operation at a room temperature is provided in accordance with the present invention.

What is claimed is:

1. An information processing structure which determines the Hamming distance between two digital patterns to be compared, having a MOSFET, and a plurality of quantum dots disposed immediately above a gate electrode of the MOSFET and each of which is made of a microconductor or microsemiconductor of a nanometer scale, wherein there is formed between each of the quantum dots and the gate electrode an energy barrier that a charge carrier consisting of either an electron or positive hole is capable of directly tunneling, and the total number of such charge carriers moved between the quantum dots and the gate electrode is used to represent information of said Hamming distance, characterized in that the structure comprises:

a power source electrode disposed adjacent to said quantum dots; and at least a pair of information electrodes disposed across said quantum dot adjacent thereto for having electric potentials applied thereto, representing data of information which are voltages for each bit of the said two digital patterns to be compared, wherein there is formed between each of said quantum dots and said power source electrode a potential barrier that a said charge carrier is capable of tunneling, a capacitive coupling is provided between said information electrodes of such a pair and the quantum dot between them to prevent movement of a said charge carrier between said quantum dot and said information electrodes, and said charge carrier is movable being limited by the Coulomb blockade through said quantum dot between said power source electrode and said gate electrode in response to a relative electric potential determined at said information electrodes, and said charge carriers moved through said quantum dot between said power source electrode and said gate electrode result in a rise in the electric potential of the gate capacitor of said MOSFET, which further are taken out as a drain current of said MOSFET, and said Hamming distance indirectly is determined by comparison of the rate of rise of said drain current.

2. An information processing structure which determines the Hamming distance between two digital patterns to be compared, having a MOSFET, and a plurality of quantum dots of a first group formed immediately above a gate electrode of the MOSFET and each of which is made of a microconductor or microsemiconductor of a nanometer scale in size, wherein there is formed between each of the quantum dots of the first group and the gate electrode an energy barrier that a charge carrier consisting of either an electron or positive hole is capable of directly tunneling, and the total number of such charge carriers moved between the quantum dots of the first group and the gate electrode is used to represent information of said Hamming distance, characterized in that the structure comprises:

a plurality of lines of quantum dots of a second group each of which lines has at least three or more quantum dots of the second group arranged adjacent to said quantum dot of the first group associated therewith but not adjacent to said gate electrode and each of which quantum dots is made of a microconductor or microsemiconductor; and a plurality of pairs of information electrodes, said information electrodes in each pair being disposed adjacent to those quantum dots of the second group which are formed at opposite ends of each of said lines, respectively, for having electric potentials applied thereto representing data of information which are voltages for each bit of said two digital patterns to be compared, wherein a capacitive coupling is provided each between said quantum dot of the first group and said quantum dots of the second group in each of said lines, and between said quantum dots of the second group in each such line and each of said information electrodes in each pair corresponding thereto to prevent movement of said charge carrier each between them, and a change in position distribution of an electron in said quantum dots of the second group in each such line in response to a relative electric potential determined at said information electrodes in the pair corresponding thereto makes said charge carrier movable or immovable being limited by the Coulomb repulsion between said quantum dot of the first group and said gate electrode, and said charge carriers moved being limited by the Coulomb repulsion between said quantum dot of the first group and said gate electrode result in a rise in the electric potential of the gate capacitor of said MOSFET, which further are taken out as a drain current of said MOSFET, and said Hamming distance is expressed as a number of electrons on said gate capacitor in stable state from said drain current.

3. An information processing structure which determines the Hamming distance between two digital patterns to be compared, characterized in that it comprises:

a line of quantum dots of a first group each of which is made of a microconductor or microsemiconductor of a nanometer scale in size and in which line there is formed between adjacent quantum dots an energy barrier that a charge carrier is capable of directly tunneling;

at least a pair of information electrodes disposed across said line of quantum dots of the first group and adjacent to those quantum dots which are located at opposite ends of said line of quantum dots of a first group, respectively, wherein there is provided a capacitive coupling between each of said information electrodes of such a pair and said quantum dot located adjacent therewith at opposite ends of said line of quantum dots of the first group to prevent movement of a charge carrier between them, for having electric potentials applied thereto, representing data of information which are voltages for each bit of said two digital patterns to be compared;

a power source electrode formed adjacent to that quantum dot of the first group, which is located at a center of said line of quantum dots of the first group, wherein there is provided a capacitive coupling between said power source electrode and said central quantum dot to prevent movement of a charge carrier between them;

a line of quantum dots of a second group each of which is made of a microconductor or microsemiconductor of a nanometer scale in size and one end of which line of quantum dots is disposed adjacent to said central quantum dot of the first group; and a gate electrode of a MOSFET disposed adjacent to the other end of said line of quantum dots of the second group, wherein there is formed each between adjacent quantum dots of the second group, and between the other end of said line of quantum dots of the second group and said gate electrode an energy barrier that a charge carrier is capable of directly tunneling, and there is provided a capacitive coupling between said central quantum dot of the first group and the quantum dot of the second group located at said one end to prevent movement of a charge carrier each between them, wherein said power source electrode is adapted to have a voltage applied thereto so that said quantum dots in the line of the first group has a potential distribution such that a potential valley is formed centering said central quantum dot of said first group, and wherein a charge carrier placed on said central quantum dot in the line of the said first group is either immobile, or movable according to thermal fluctuation to one of the information electrode in the pair, depending upon a potential distribution determined by relative voltages at said information electrodes of the first group, and wherein the existence or the nonexistence of said charge carrier placed on the central quantum dot makes a charge carrier of said quantum dot of the second group movable or immovable being limited by the Coulomb repulsion between said quantum dots of the second group and said gate electrode, and said charge carriers moved between said quantum dots and said gate electrode result in a rise in the electric potential of the gate capacitor of said MOSFET, which further are taken out as a drain current of said MOSFET, and said Hamming distance is expressed as a number of electrons on said gate capacitor in stable state from said drain current, and wherein said thermal fluctuation makes it possible to operate at a room temperature.

4. An information processing structure which determines the Hamming distance between two digital patterns to be compared as set forth in any one of claim 1, 2 and 3, characterized in that said information electrode is formed by at least one quantum dot of a third group made of a micro-conductor or microsemiconductor, and an electrode capacitively coupled to said quantum dot, and each said quantum dots stores aforesaid voltage for each bit of the two digital patterns to be compared, by holding charge carriers of the number corresponding to said voltage.

* * * * *